(12) United States Patent
Datta et al.

(10) Patent No.: US 12,316,355 B2
(45) Date of Patent: May 27, 2025

(54) RECONFIGURABLE OUTPUT BALUN FOR WIDEBAND PUSH-PULL POWER AMPLIFIERS

(71) Applicant: Skyworks Solutions, Inc., Irvine, CA (US)

(72) Inventors: Kunal Datta, Sunnyvale, CA (US); Hemin Wu, San Jose, CA (US); Shanshan Zhao, San Jose, CA (US); Sheikh Nijam Ali, San Jose, CA (US); Jinghang Feng, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 296 days.

(21) Appl. No.: 17/811,659

(22) Filed: Jul. 11, 2022

(65) Prior Publication Data

US 2023/0024830 A1    Jan. 26, 2023

Related U.S. Application Data

(60) Provisional application No. 63/203,502, filed on Jul. 26, 2021.

(51) Int. Cl.
*H04B 1/04* (2006.01)
*H03F 3/21* (2006.01)
*H03F 3/26* (2006.01)

(52) U.S. Cl.
CPC ............. *H04B 1/04* (2013.01); *H03F 3/211* (2013.01); *H03F 3/265* (2013.01); *H04B 2001/0416* (2013.01); *H04B 2001/0433* (2013.01)

(58) Field of Classification Search
CPC .. H03F 1/0227; H03F 1/0266; H03F 2200/06; H03F 2200/09; H03F 2200/111;
(Continued)

(56) References Cited

U.S. PATENT DOCUMENTS 6,057,714 A    5/2000    Andrys et al.
6,466,770 B1   10/2002   Griffith et al.
(Continued)

FOREIGN PATENT DOCUMENTS

KR    20200006920 A   *   1/2020

OTHER PUBLICATIONS

Merriam-Webster Dictionary meaning of "balun", printed on Sep. 2, 2024. Retrieved from Internet: <https://www.merriam-webster.com/dictionary/balun> (Year: 2024).*
(Continued)

*Primary Examiner* — Ronald Eisner
(74) *Attorney, Agent, or Firm* — Knobbe, Martens, Olson & Bear, LLP

(57) ABSTRACT

Reconfigurable output baluns for wideband push-pull amplifiers are disclosed. In certain embodiments, a mobile device includes a transceiver that generates a first radio frequency signal of a first frequency band and a second radio frequency signal of a second frequency band, and a front-end system including a push-pull power amplifier that selectively amplifies one of the first radio frequency signal or the second radio frequency signal based on a band control signal. The push-pull power amplifier includes an input balun, an output balun, and a pair of amplifiers coupled between the input balun and the output balun. The band control signal is operable to control an impedance of the output balun.

20 Claims, 14 Drawing Sheets

(58) Field of Classification Search
CPC ......... H03F 2200/294; H03F 2200/429; H03F 2200/451; H03F 2200/516; H03F 2203/7209; H03F 3/181–195; H03F 3/211; H03F 3/245; H03F 3/265; H03F 3/72; H04B 1/04; H04B 1/12; H04B 1/123; H04B 2001/0416; H04B 2001/0433

See application file for complete search history.

(56) References Cited

U.S. PATENT DOCUMENTS

| | | | |
|---|---|---|---|
| 6,853,526 | B1 | 2/2005 | Van Saders et al. |
| 6,871,059 | B1 | 3/2005 | Piro et al. |
| 8,264,297 | B2 | 9/2012 | Thompson |
| 9,450,541 | B2 | 9/2016 | Beltran et al. |
| 9,450,639 | B2 | 9/2016 | Zhang et al. |
| 9,467,115 | B2 | 10/2016 | Lyalin |
| 9,800,207 | B2 | 10/2017 | Datta et al. |
| 9,866,196 | B2 | 1/2018 | Gorbachov |
| 9,912,299 | B2 | 3/2018 | Lyalin |
| 10,044,400 | B2 | 8/2018 | Zhang et al. |
| 10,110,184 | B2 | 10/2018 | Lyalin et al. |
| 10,340,861 | B2 | 7/2019 | Ye et al. |
| 10,355,647 | B2 | 7/2019 | Datta et al. |
| 10,411,662 | B2 | 9/2019 | Lyalin et al. |
| 10,536,187 | B2 | 1/2020 | Zhang et al. |
| 10,566,946 | B2 | 2/2020 | Gorbachov |
| 10,637,412 | B2 | 4/2020 | Ye et al. |
| 10,944,367 | B2 | 3/2021 | Lyalin et al. |
| 11,283,416 | B2 | 3/2022 | Cao et al. |
| 2006/0006939 | A1* | 1/2006 | Burns .............. H03F 3/195 330/124 R |
| 2008/0101263 | A1 | 5/2008 | Barber et al. |
| 2020/0136670 | A1 | 4/2020 | Zhang et al. |
| 2021/0175865 | A1 | 6/2021 | Lee et al. |
| 2021/0218373 | A1 | 7/2021 | Jain et al. |
| 2022/0140498 | A1 | 5/2022 | Naraine et al. |
| 2022/0140499 | A1 | 5/2022 | Naraine et al. |
| 2022/0190803 | A1 | 6/2022 | Azizi et al. |
| 2022/0376662 | A1* | 11/2022 | Datta .............. H03F 3/3083 |
| 2022/0376733 | A1* | 11/2022 | Datta .............. H03F 3/26 |

OTHER PUBLICATIONS

Translation of publication No. KR20200006920A, printed on Sep. 3, 2024, retrieved from Internet: <https://patents.google.com/patent/KR20200006920A/en?oq=KR20200006920A> (Year: 2024).*

* cited by examiner

RECONFIGURABLE OUTPUT BALUN FOR WIDEBAND PUSH-PULL POWER AMPLIFIERS

CROSS-REFERENCE TO RELATED APPLICATIONS

This application claims the benefit of priority under 35 U.S.C. § 119 of U.S. Provisional Patent Application No. 63/203,502, filed Jul. 26, 2021 and titled "RECONFIGURABLE OUTPUT BALUN FOR WIDEBAND PUSH-PULL POWER AMPLIFIERS," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a first radio frequency signal of a first frequency band and a second radio frequency signal of a second frequency band, and a front-end system including a push-pull power amplifier configured to selectively amplify one of the first radio frequency signal or the second radio frequency signal based on a band control signal. The push-pull power amplifier includes an input balun, an output balun, and a pair of amplifiers coupled between the input balun and the output balun, the band control signal operable to control an impedance of the output balun.

In some embodiments, the pair of amplifiers includes a first amplifier having a first output and a second amplifier having a second output, the output balun including a first coupled line connected between the first output and the second output, a second coupled line electromagnetically coupled to the first coupled line, and at least one controllable capacitor controlled by the band control signal. According to a number of embodiments, the at least one controllable capacitor includes a first controllable capacitor coupled to a center tap of the first coupled line. In accordance with several embodiments, the at least one controllable capacitor includes a first controllable capacitor coupled to one end of the second coupled line, the other end of the second coupled line configured to generate an amplified radio frequency signal. According to various embodiments, the at least one controllable capacitor includes a first controllable capacitor coupled to a center tap of the first coupled line, and a second controllable capacitor coupled to one end of the second coupled line, the other end of the second coupled line configured to generate an amplified radio frequency signal. In accordance with a number of embodiments, the first amplifier includes a first bipolar transistor and the second amplifier includes a second bipolar transistor, the first coupled line connected between a collector of the first bipolar transistor and a collector of the second bipolar transistor. According to several embodiments, the at least one controllable capacitor includes a first controllable capacitor including a first fixed capacitor in parallel with a switched capacitor. In accordance with various embodiments, the switched capacitor incudes a plurality of field-effect transistors in series with a second fixed capacitor, the plurality of field-effect transistors having a gate voltage controlled by the band control signal.

In several embodiments, the first frequency band is mid-band (MB) transmit band and the second frequency band is high band (HB) transmit band.

In some embodiments, the pair of amplifiers each further include an amplification transistor and a controllable ballasting network coupled to an input of the amplification transistor, the controllable ballasting network including at least one of a capacitance or a resistance that changes based on the band control signal.

In various embodiments, the push-pull power amplifier further includes a first controllable input capacitor for the pair of amplifiers, the first controllable input capacitor having a capacitance that changes based on the band control signal.

In several embodiments, the pair of amplifiers includes a first amplifier having a first output and a second amplifier having a second output, the push-pull power amplifier further including a controllable output capacitor coupled between the first output and the second output, the controllable output capacitor having a capacitance that changes based on the band control signal.

In certain embodiments, the present disclosure relates to a method of amplification in a mobile device. The method includes generating a first radio frequency signal of a first frequency band and a second radio frequency signal of a second frequency band using a transceiver, selecting one of the first radio frequency signal or the second radio frequency signal as a selected radio frequency signal based on a band control signal, and amplifying the selected radio frequency signal using a push-pull power amplifier that includes an input balun, an output balun, and a pair of amplifiers coupled between the input balun and the output balun. The method further includes controlling an impedance of the output balun based on the band control signal.

In various embodiments, the pair of amplifiers includes a first amplifier having a first output connected to one end of a first coupled line of the output balun and a second amplifier having a second output connected to another end of the first coupled line, the method further including controlling a capacitance of a controllable capacitor connected to a second coupled line of the output balun using the band control signal.

In certain embodiments, the present disclosure relates to a push-pull power amplifier. The push-pull amplifier includes an input selection circuit configured to output a selected radio frequency signal based on a band control signal, the selected radio frequency signal chosen from one of a first radio frequency signal of a first frequency band or a second radio frequency signal of a second frequency band.

The push-pull amplifier further includes an input balun, an output balun, and a pair of amplifiers including a pair of inputs connected to the input balun and a pair of outputs, the pair of amplifiers operable to amplify the selected radio frequency signal. The output balun is connected to the pair of outputs of the pair of amplifiers, the band control signal operable to control an impedance of the output balun.

In some embodiments, the output balun includes a first coupled line connected between a first output of the pair of outputs and a second output of the pair of outputs, a second coupled line electromagnetically coupled to the first coupled line, and at least one controllable capacitor controlled by the band control signal. According to a number of embodiments, the at least one controllable capacitor includes a first controllable capacitor coupled to a center tap of the first coupled line. In accordance with various embodiments, the at least one controllable capacitor includes a first controllable capacitor coupled to one end of the second coupled line, the other end of the second coupled line configured to generate an amplified radio frequency signal. According to several embodiments, the first amplifier includes a first bipolar transistor and the second amplifier includes a second bipolar transistor, the first coupled line connected between a collector of the first bipolar transistor and a collector of the second bipolar transistor. In accordance with a number of embodiments, the at least one controllable capacitor includes a first controllable capacitor including a first fixed capacitor in parallel with a switched capacitor. According to various embodiments, the switched capacitor incudes a plurality of field-effect transistors in series with a second fixed capacitor, the plurality of field-effect transistors having a gate voltage controlled by the band control signal.

DETAILED DESCRIPTION OF EMBODIMENTS

Figure 1:
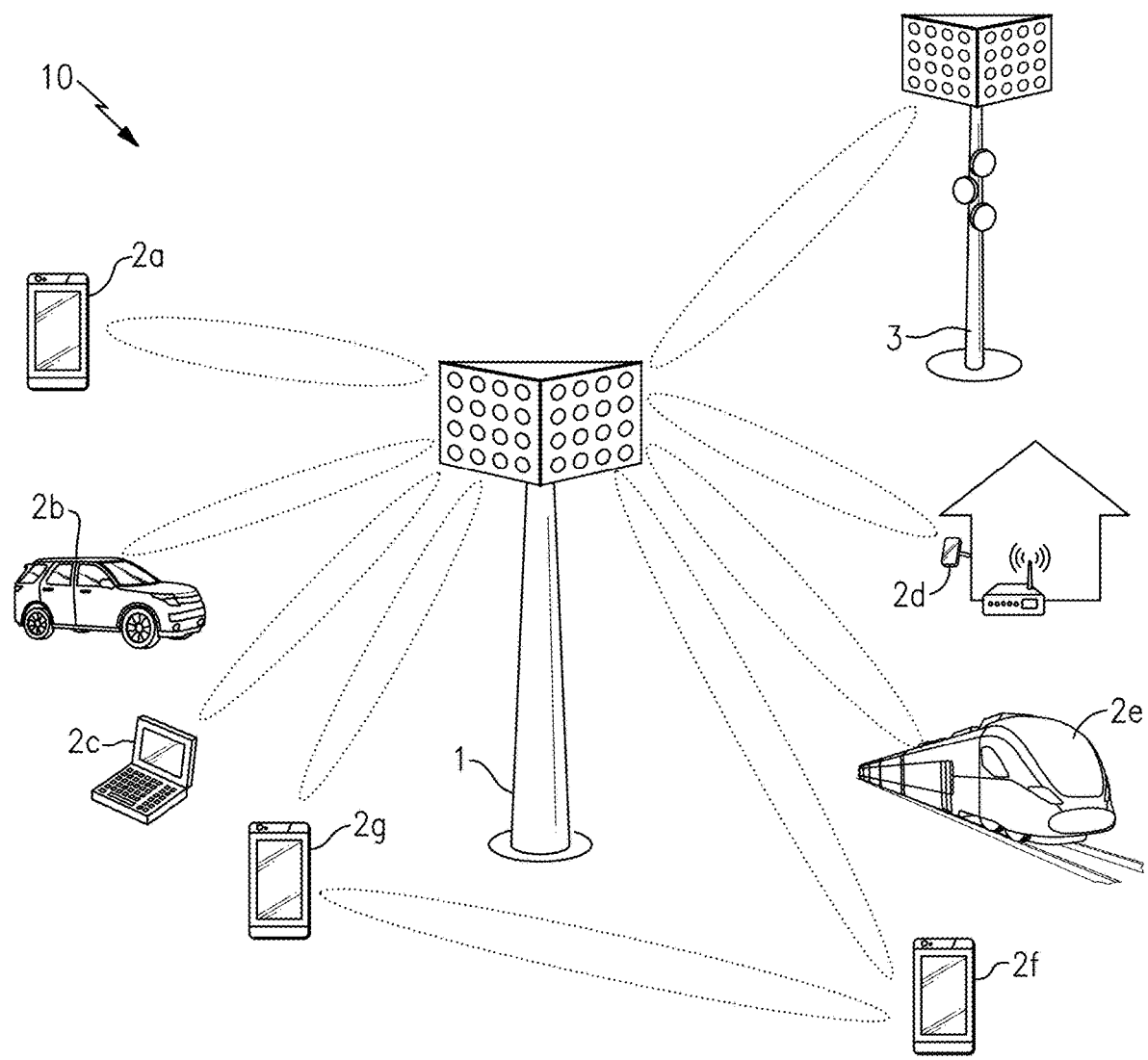
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IoT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
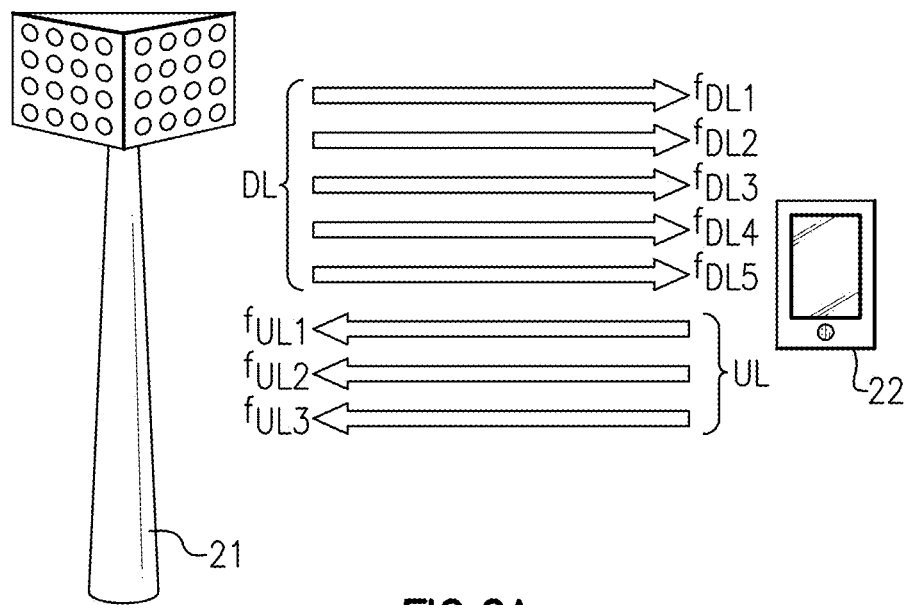
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
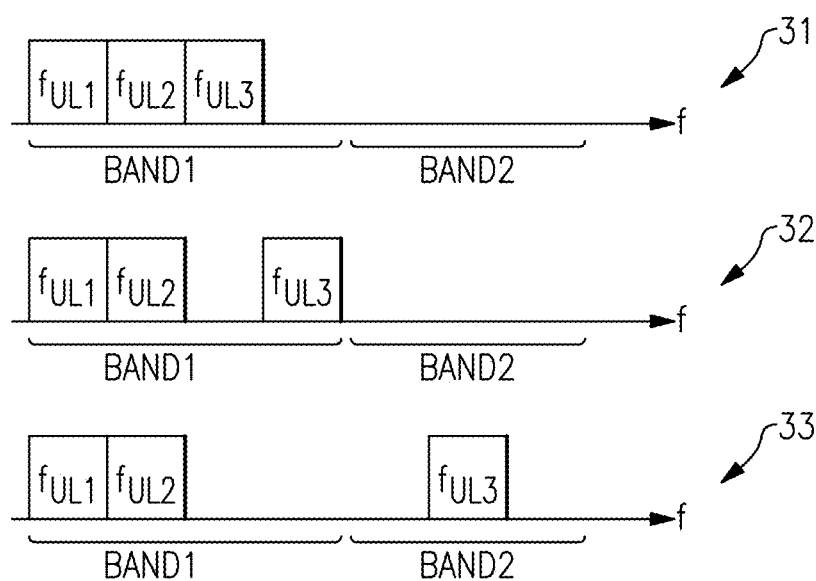
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
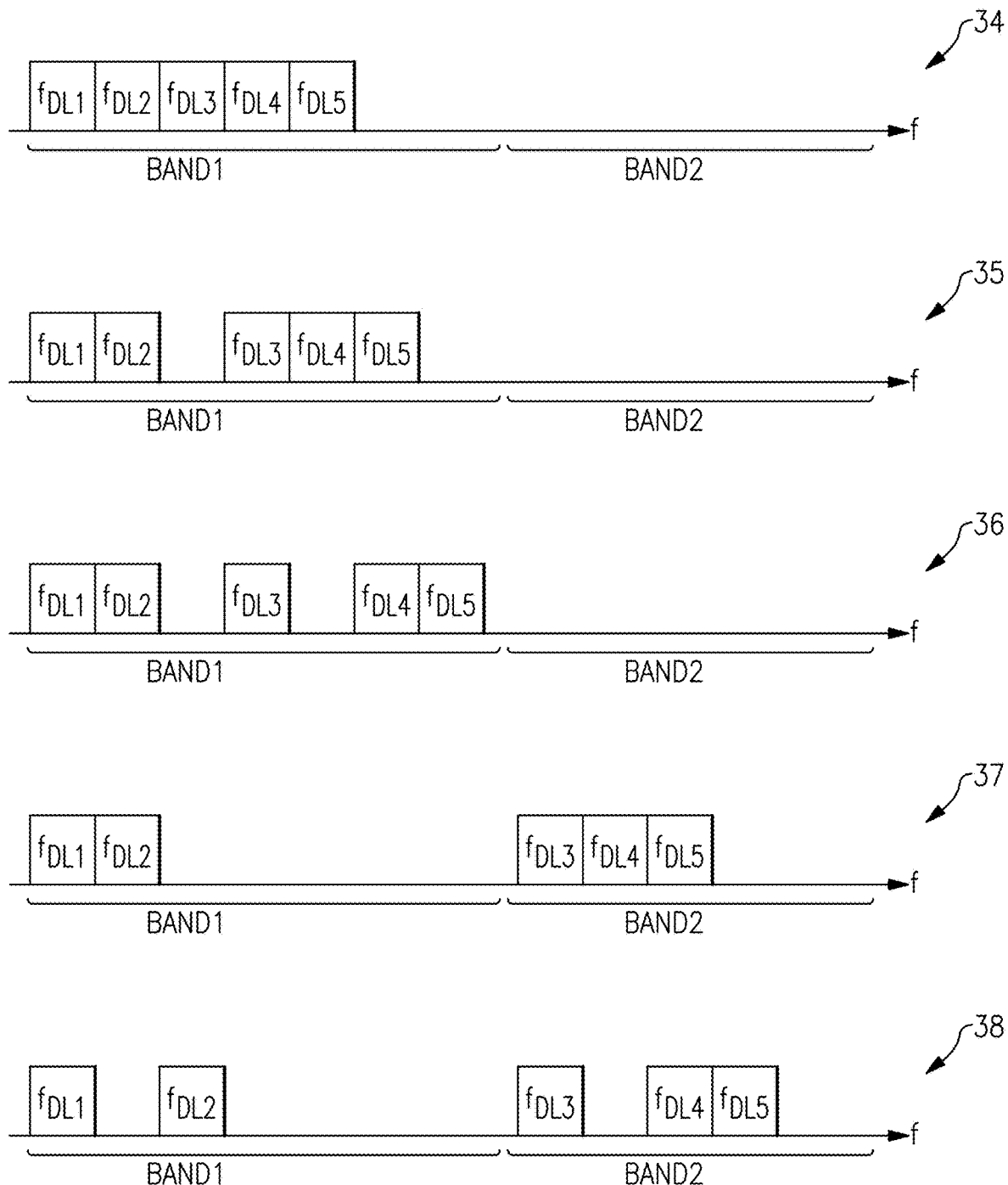
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
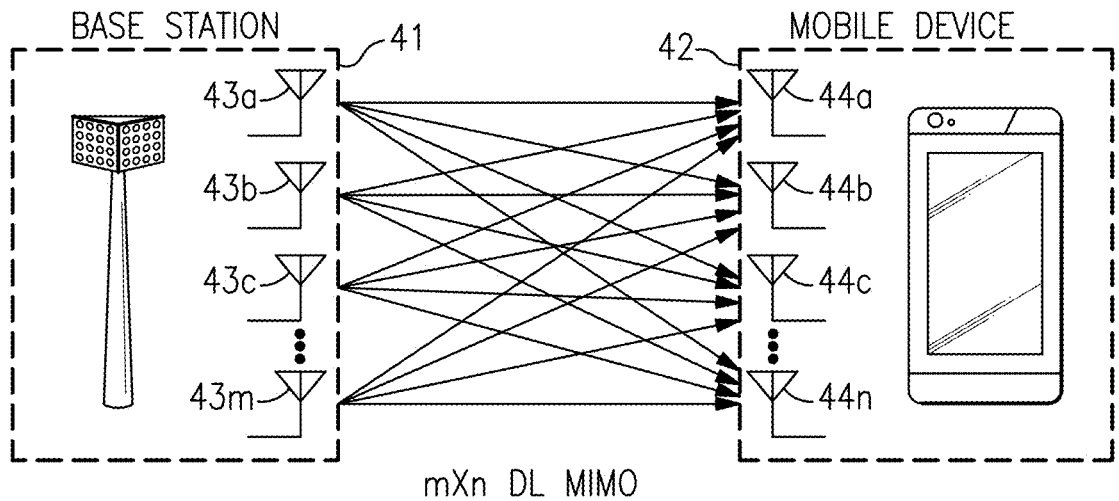
FIG. 3A is a schematic diagram of one example of a downlink channel using multi-input and multi-output (MIMO) communications.
Figure 3B:
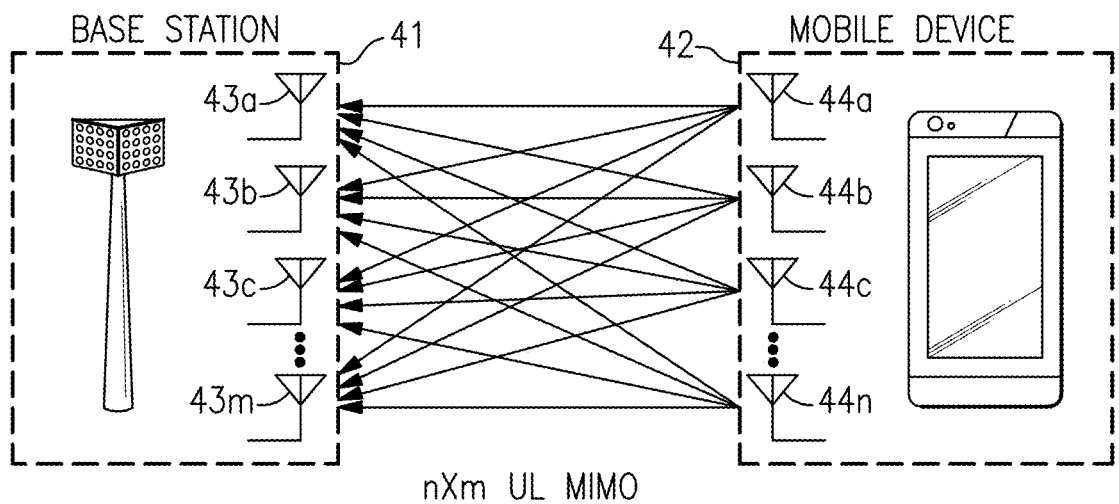
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
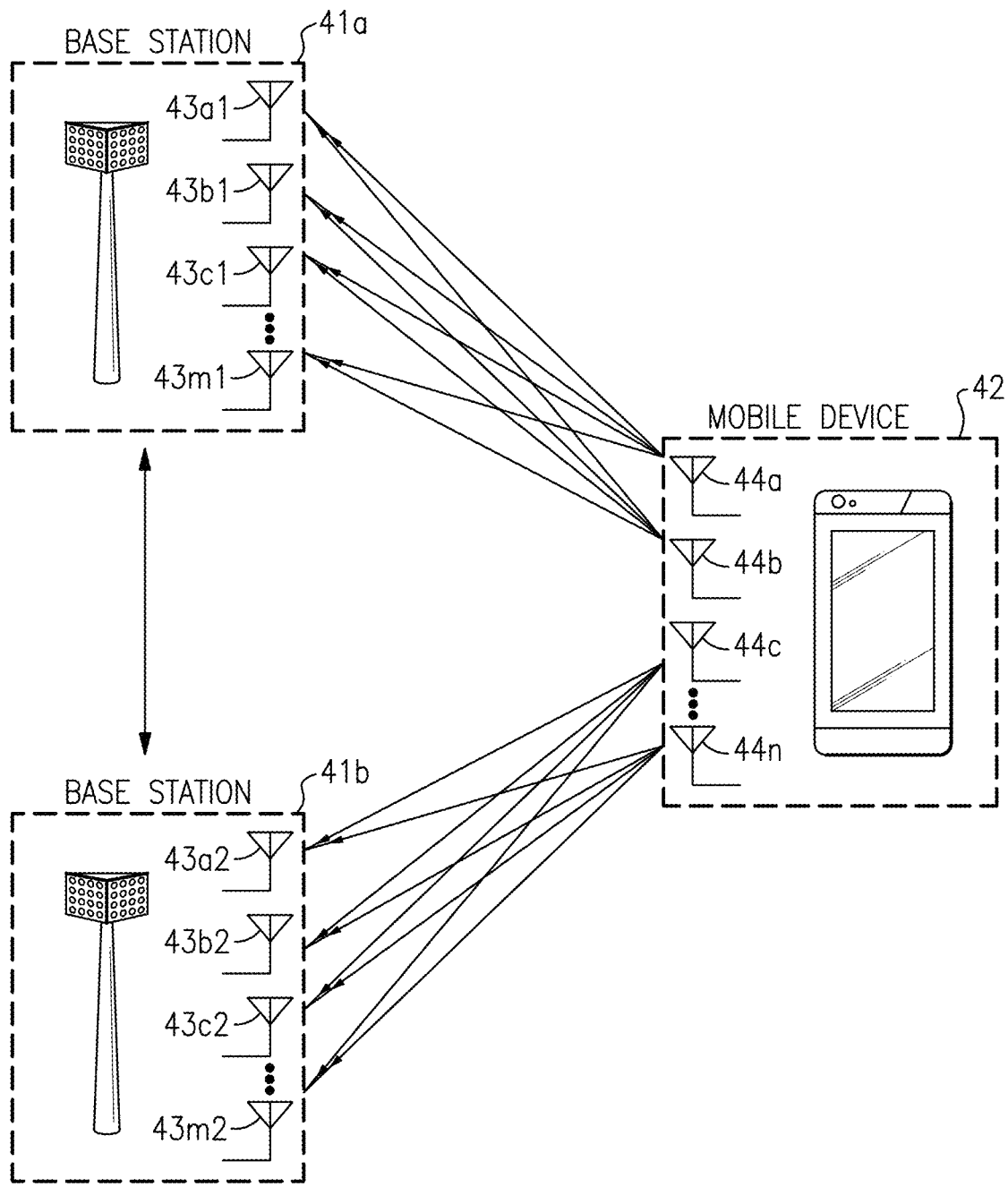
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
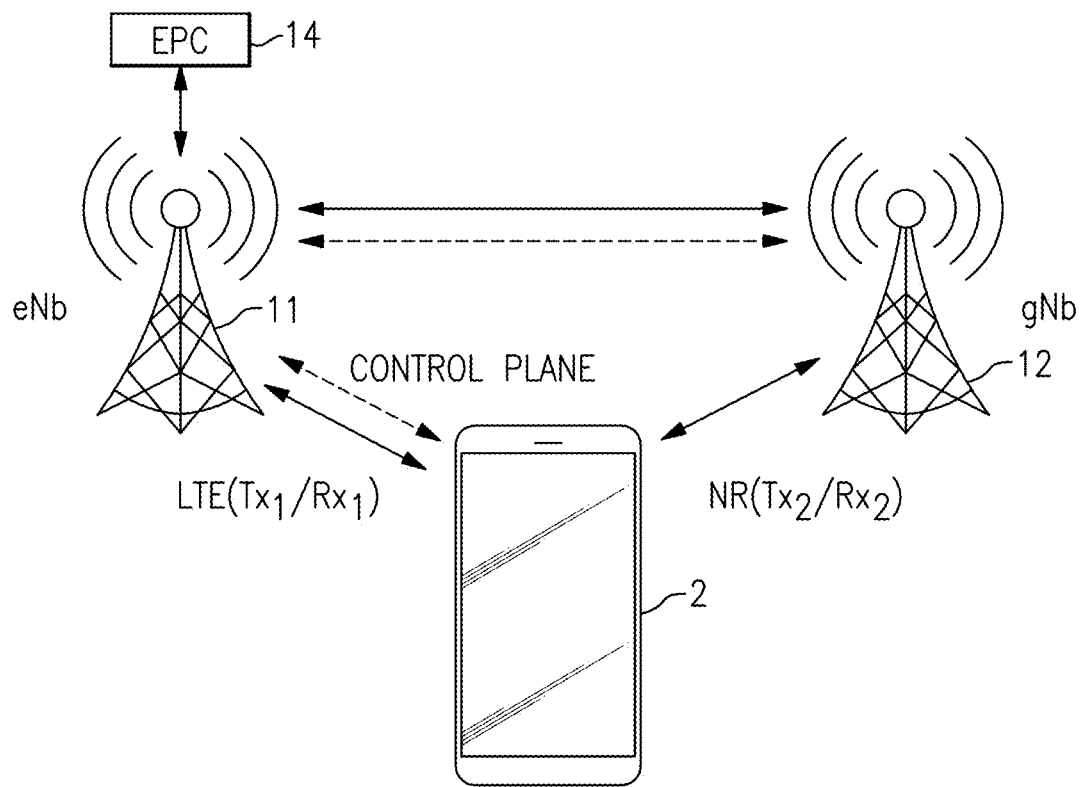
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

Examples of Wideband Push-Pull Amplifiers for Cellular UE

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal to noise ratio, improved coding, and/or reduced signal interference due to spatial multiplexing differences of the radio environment. MIMO order refers to a number of separate data streams sent or received.

Figure 5:
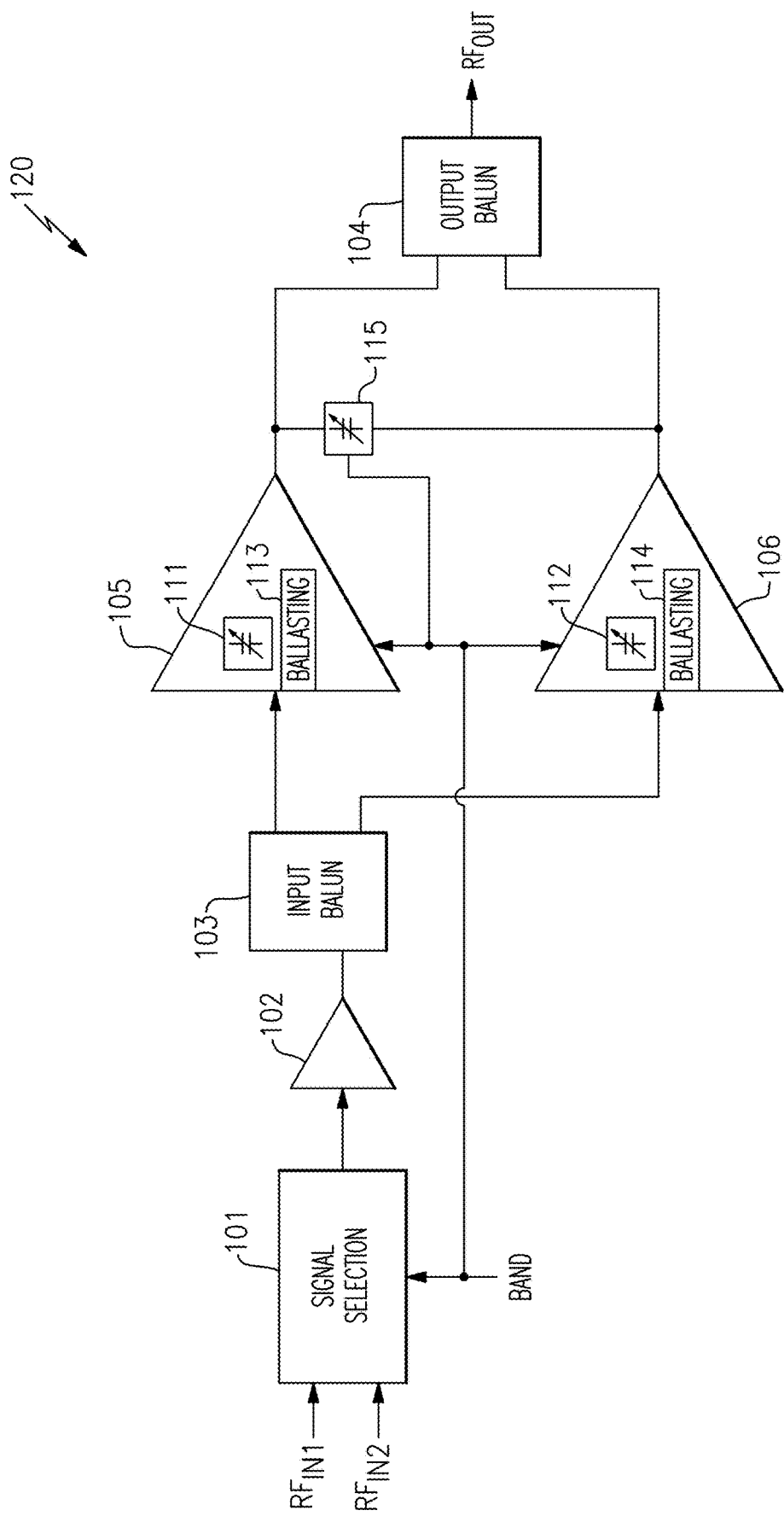
FIG. 5 is a schematic diagram of a broadband push-pull power amplifier according to one embodiment.

FIG. 5 is a schematic diagram of a broadband push-pull power amplifier 120 according to one embodiment. The broadband push-pull power amplifier 120 includes a signal selection circuit 101, a driver amplifier 102, an input balun 103, an output balun 104, a first output amplifier 105, a second output amplifier 106 (the first output amplifier 105 and the second output amplifier 106 are collectively referred to herein as a pair of amplifiers), and a controllable output capacitor 115. The first output amplifier 105 includes a first controllable input capacitor 111 and a first controllable ballasting network 113. Additionally, the second output amplifier 106 includes a second controllable input amplifier 112 and a second controllable ballasting network 114.

The output balun 104 can be implemented as a reconfigurable output balun in accordance with any of the embodiments herein. Although FIG. 5 illustrates one example of a broadband push-pull power amplifier that can benefit from a reconfigurable output balun, the reconfigurable output baluns disclosed herein can be used in combination with other implementations of amplifiers.

As shown in FIG. 5, the signal selection circuit 101 receives a first RF input signal $RF_{IN1}$ of a first frequency band, a second RF input signal $RF_{IN2}$ of a second frequency band, and a band control signal BAND for controlling operation of the reconfigurable power amplifier 120 in the first frequency band or the second frequency band.

The band control signal BAND is used for selecting the first RF input signal $RF_{IN1}$ or the second RF input signal $RF_{IN2}$ for amplification by the broadband push-pull power amplifier 120. The band control signal BAND is also used to control the controllable output capacitor 115, thus choosing an output capacitance suitable for the chosen frequency band. Additionally or alternatively, the band control signal BAND is used to control an input capacitance of the first output amplifier 105 and the second output amplifier 106, thereby setting the input capacitance to a suitable value for the chosen frequency band.

The ballasting network of each output amplifier is also controlled by the band control signal BAND, in this embodiment.

The first frequency band and the second frequency band can correspond to any two suitable frequency bands. In one example, first frequency band is a mid band MB and the second frequency band is a high band HB. For instance, MB transmit band can range from 1.7 GHz to 2.0 GHz, while HB transmit band can range from 2.3 GHz to 2.7 GHz. In other examples, the two frequency bands correspond to a configuration using two 5G bands (such as N77 (3.3 GHz to 4.2 GHz) and N79 (4.4 GHz to 5.0 GHz)), two different 4G bands, or a 4G band and a 5G band.

Accordingly, the broadband push-pull power amplifier 120 utilizes multiple configurability techniques in combination with a reconfigurable output balun 104 to enable a single push-pull differential power amplifier to operate over multiple frequency bands. Thus wide bandwidth operation is achieved, for instance, 40% fractional bandwidth or more.

For example, the reconfigurable output balun 104 can enable a single push-pull differential power amplifier to operate over both MB transmit band and HB transmit band. Thus, reduced area and/or cost savings are achieved relative to an implementation using multiple push-pull amplifiers. To cover the entire MB/HB transmit bandwidth (from 1.7 GHz to 2.7 GHz), fractional bandwidth of nearly 50% is needed, which conventional output balun structures are unable to provide.

Accordingly, the reconfigurable output balun 104 aids in enabling the broadband push-pull power amplifier 120 to achieve good output power, high power added efficiency (PAE), and linear power operation over both frequency bands. By using the same power amplifier for both frequency bands, reduced die cost, fewer surface mount component, and/or smaller module area can be achieved.

One or more configurable components of the broadband push-pull power amplifier 120 can operate in combination with the reconfigurable output balun 104 to achieve greater flexibility across frequency modes.

For example, in certain embodiments, the broadband push-pull power amplifier 120 is operable in a high frequency mode and a low frequency mode. Additionally, each of the controllable components have component values selected to achieve robust performance for each of the frequency modes.

In one example, the controllable output capacitor 115 is used to ensure wideband operation and harmonic termination (for instance, third-order harmonic termination) at the output of the first output amplifier 105 and the output of the second output amplifier 106. Thus, the controllable output capacitor 115 can have a first output capacitance value in the low frequency mode and a second output capacitance value in the high frequency mode.

In another example, the first controllable input capacitor 111 and the second controllable input capacitor 112 each provide a first input capacitance value in the low frequency mode and a second input capacitance value in the high frequency mode. Such switchable input capacitance can be used to ensure wideband operation of the input balun 103, which can be integrated on-chip with the first output amplifier 105 and the second output amplifier 106 in certain implementations.

In yet another example, the first ballasting network 113 and the second ballasting network 114 each provide a first resistance and a first capacitance value in the low frequency mode, and a second resistance and a second capacitance value in the high frequency mode. Such switchable resistor-capacitor (RC) ballasting can provide desired compensation for amplitude distortion (AM/AM) and phase distortion (AM/PM). For instance, such RC ballasting can provide desired AM/AM and/or AM/PM expansion for a give frequency mode.

Figure 6:
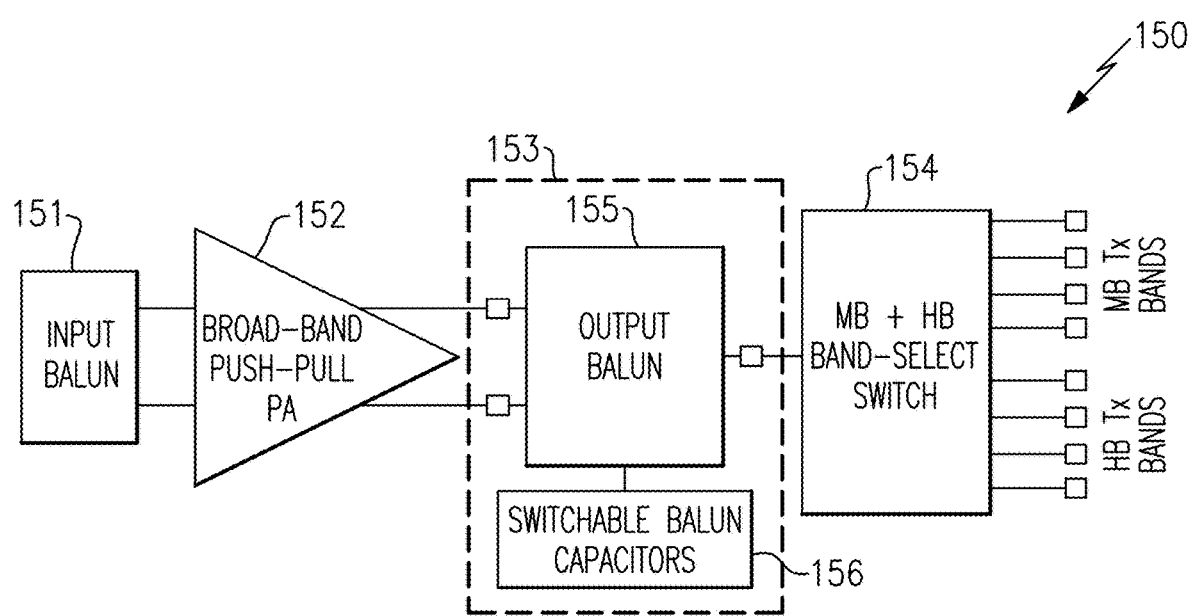
FIG. 6 is a schematic diagram of a broadband push-pull power amplifier according to another embodiment.

FIG. 6 is a schematic diagram of a broadband push-pull power amplifier 150 according to another embodiment. The broadband push-pull power amplifier 150 includes an input balun 151, a broadband push-pull power amplifier 152 (including a pair of amplifiers), a reconfigurable output balun 153, and a band-select switch 154. The reconfigurable output balun 153 includes an output balun 155 and switchable balun capacitors 156.

The broadband push-pull power amplifier 150 of FIG. 6 uses a MB/HB single push-pull power amplifier 152 and output balun 153 architecture. As shown in FIG. 6, a reconfigurable output balun architecture provides a wideband push-pull power amplifier with load-line impedance suitable for the power amplifier to operate over multiple frequency bands (corresponding to MB and HB transmit Band frequencies, in this embodiment). Moreover, in implementations in which the power amplifier operates as a switching class of power amplifiers (for instance, Class-F or inverse Class—F) at MB/HB frequencies, the reconfigurable balun architecture also provides suitable second harmonic impedance at those frequencies.

Figure 7:
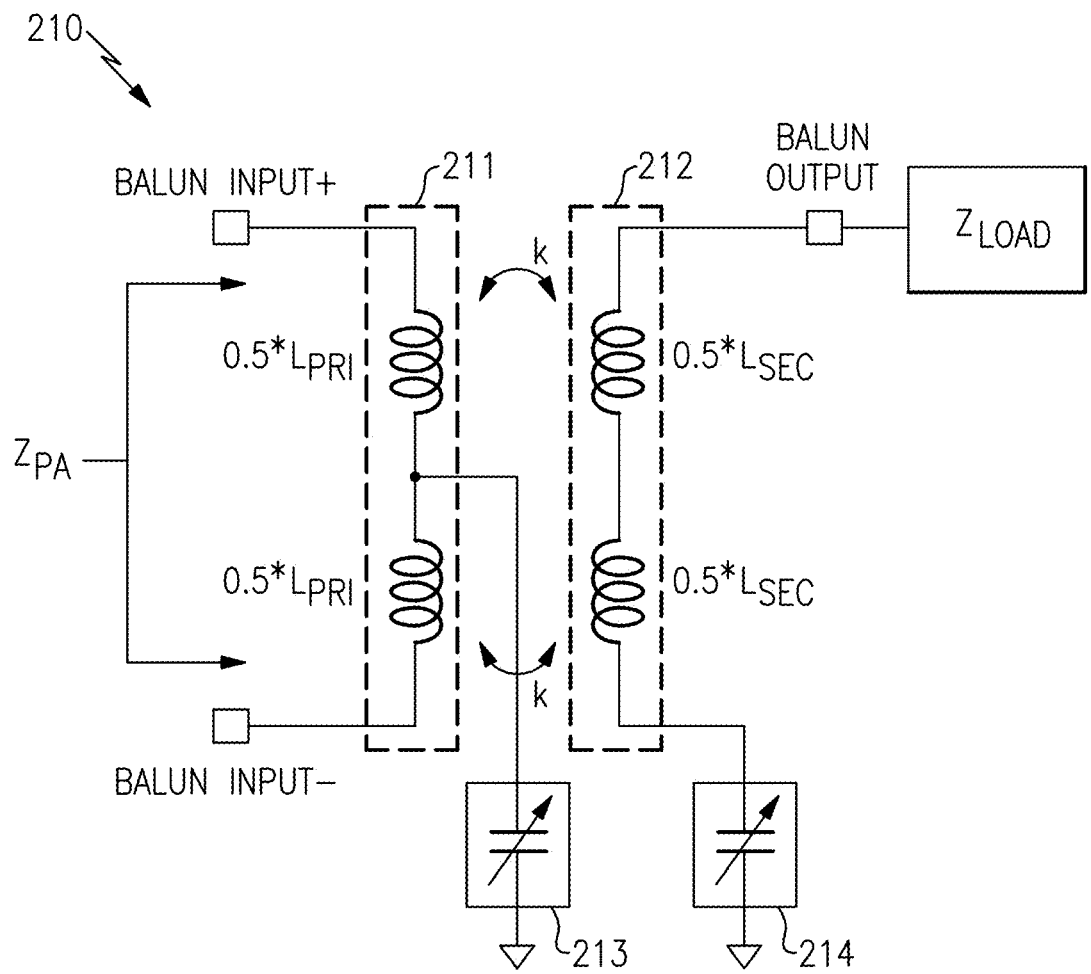
FIG. 7 is a schematic diagram of a reconfigurable output balun according to one embodiment.

Accordingly, the reconfigurable output balun architecture can serve first to provide broadband operation, for instance, a MB Mode in which proper load-line impedance is provided to the power amplifier at MB transmit band frequencies during MB power amplifier operation, and an HB Mode in which proper load-line impedance is provided to the power amplifier at HB transmit band frequencies during HB power amplifier operation. Second, the reconfigurable output balun architecture can serve to provide switchable capacitors 156 at certain balun terminals (for instance, center tap CTAP and/or ground CGND terminals) which can be turned ON/OFF during "MB Mode/HB Mode" depending on the transmit band being transmitted. Third, the reconfigurable output balun architecture can serve to enable a single power amplifier to support either the MB transmit frequency band or HB transmit frequency band depending on mode of operation FIG. 7 is a schematic diagram of a reconfigurable output balun 210 according to one embodiment. The reconfigurable output balun 210 includes a first or primary coupled line 211, a second or secondary coupled line 212, a first controllable capacitor 213, and a second controllable capacitor 214.

In the illustrated embodiment, a coupled inductor balun structure 211/212 is included along with two controllable (for instance, switchable/tunable) capacitors including the first controllable capacitor 213 ($C_{TAP}$) and the second controllable capacitor 214 ($C_{GND}$). When operating in MB Mode, the balun should provide flat load-line impedance (ZPA) across the MB transmit bands (1.7 GHz-2 GHz). However, when operating in HB Mode, the same balun should provide flat load-line impedance across the HB transmit bands (2.3 GHz–2.7 GHz). The load-line impedance ($Z_{PA}$) desired depends on the power amplifier specifications, but in one example is around 12 Ohms differential impedance (or 6 Ohms single-ended impedance).

The coupled inductor balun has a coupling factor k between the first coupled line 211 and the second coupled line 212. The coupling factor k serves the role of impedance transformation, transforming the antenna impedance ($Z_{LOAD}$) to the power amplifier impedance ($Z_{PA}$) desired by the push-pull power amplifier. The first controllable capacitor 213 and the second controllable capacitor 214 serve to provide frequency selectivity in the balun.

For example, the frequency at which the balun presents the transformed impedance of $Z_{PA}$ to the PA can be estimated to be $\omega Z_{PA} = 1/\text{srt}[(1-k^2)L_{SEC}*C_{GND}]$. Since the coupled inductor structure is fixed with substantially fixed values of primary inductance ($L_{PRI}$) and secondary inductance ($L_{SEC}$), the second controllable capacitor 214 ($C_{GND}$) can be tuned to center the balun output impedance $Z_{PA}$ over MB or HB Tx band frequencies.

Figure 8A:
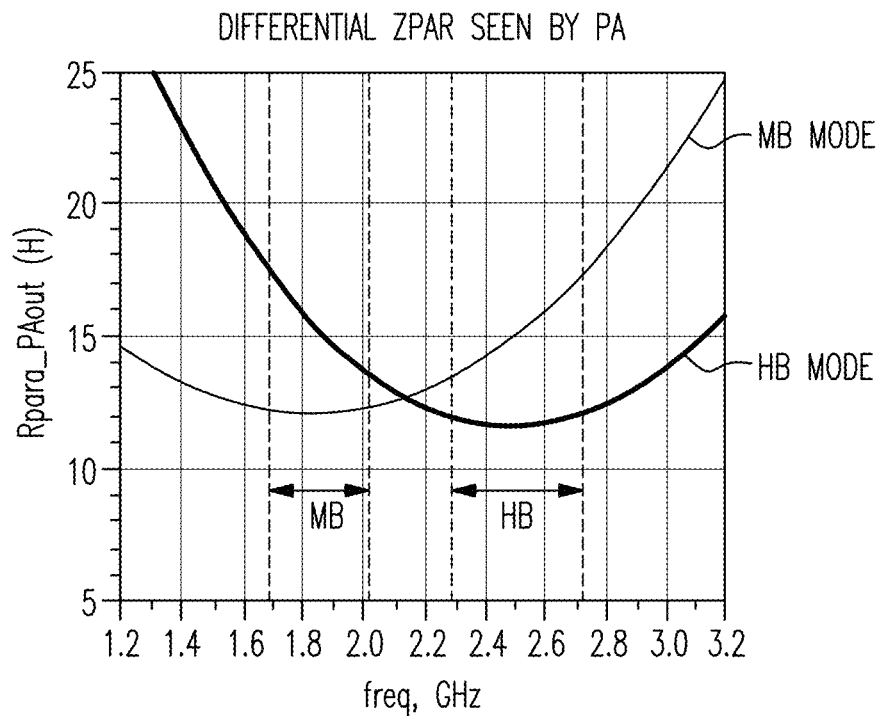
FIG. 8A is a graph of one example of differential balun impedance presented to a push-pull power amplifier for two different frequency modes.
Figure 8B:
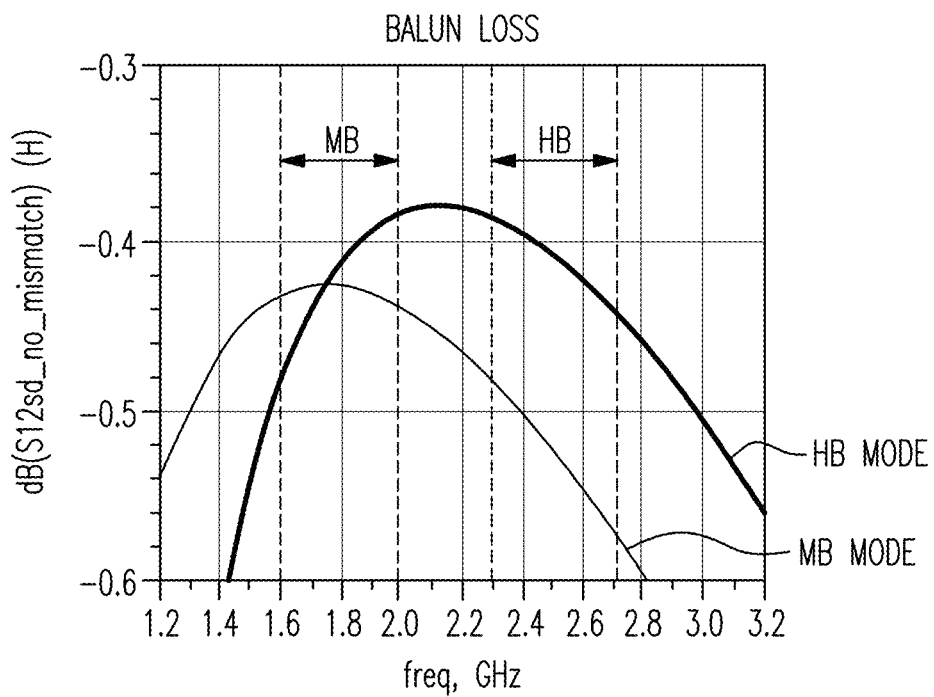
FIG. 8B is a graph of one example of balun loss for two different frequency modes.

FIG. 8A is a graph of one example of differential balun impedance presented to a push-pull power amplifier for two different frequency modes. FIG. 8B is a graph of one example of balun loss for two different frequency modes. The simulations correspond to one example of simulations for the output balun structure 210 of FIG. 7.

As shown in the simulation results of FIG. 8A, for $C_{GND}=C_{GND}$-MB, the balun output impedance $Z_{PA}$ is about 12 Ohms over MB transmit band frequencies (1.7 GHz-2 GHz). Additionally, for $C_{GND}=C_{GND}$-HB, the balun output impedance ZPA is about 12 Ohms over HB transmit Band frequencies (2.3 GHz-2.7 GHz). Thus, controlling $C_{GND}$ also ensures the insertion loss of the balun is low for MB frequencies during MB mode and over HB frequencies during HB mode of operation, as seen in FIG. 8B.

Figure 9:
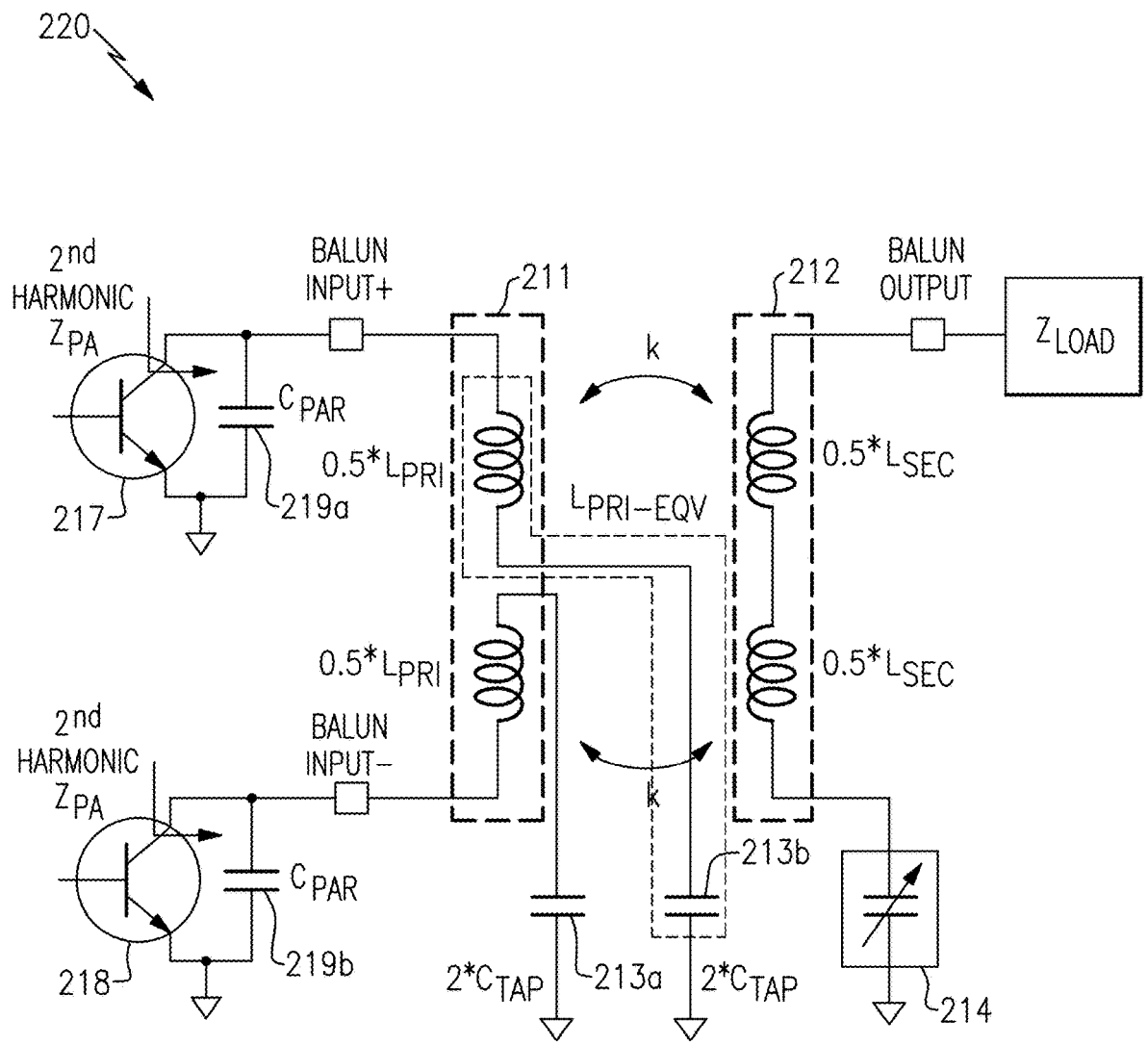
FIG. 9 is a schematic diagram of a reconfigurable output balun according to another embodiment.

FIG. 9 is a schematic diagram of a reconfigurable output balun 220 according to another embodiment. The reconfigurable output balun 220 of FIG. 9 is similar to the reconfigurable output balun 210 of FIG. 7, except that the reconfigurable output balun 220 depicts the first controllable capacitor $C_{TAP}$ as a first capacitor component 213a (of value $2*C_{TAP}$ in this setting) and a second capacitor component 213b (of value $2*C_{TAP}$ in this setting). Additionally, the reconfigurable output balun 220 is depicted as being driven by a first bipolar transistor 217 of a first amplifier and by a second bipolar transistor 218 of a second amplifier. A first parasitic capacitor 219a (of value $C_{PAR}$) is associated with the output of the first amplifier, while a second parasitic capacitor 219b (of value $C_{PAR}$) is associated with the output of the second amplifier.

To achieve high efficiency, a power amplifier that drives the output balun can be designed for Class-F or inverse Class-F type switching power amplifier operation. In such implementations, the output balun should provide open/short circuit at second harmonic frequencies to the power amplifier. The proposed reconfigurable output balun 220 can provide open/short second harmonic impedance by switching the value of the $C_{TAP}$ capacitor depicted in FIG. 9.

For example, for Class-F operation of the power amplifier, the $C_{TAP}$ value can be chosen to provide short circuit at the second harmonic impedance, or $\omega_{2f0}$-Class-F=1/sqrt $[L_{PRI}*C_{TAP}]$. For $C_{TAP}=C_{TAP}$-MB-ClassF, the second harmonic is shorted for MB transmit second harmonic frequencies (for instance, 3.4 GHz-4 GHz), while for $C_{TAP}=C_{TAP}$-HB-ClassF, the second harmonic is shorted for HB second harmonic frequencies (i.e. 4.6 GHz-5.4 GHz).

For inverse Class-F PA operation, the parasitic shunt capacitor ($C_{PAR}$) of the power amplifier transistors should resonate in parallel with the equivalent primary inductance ($L_{PRI}$-EQV) from the output balun. A switchable $C_{TAP}$ can also ensure the parallel resonance for inverse Class-F operation can be shifted from MB to HB transmit frequencies. The equivalent primary inductance is given by $L_{PRI}$-EQV=$L_{PRI}$-1/($\omega^2*C_{TAP}$). For $C_{TAP}=C_{TAP}$-MB-InvClassF, the $L_{PRI}$-EQV-MB resonates with $C_{PAR}$ to provide open circuit at MB second harmonic frequencies (i.e. 3.4 GHz–4 GHz). Similarly for $C_{TAP}=C_{TAP}$-HB-InvClassF, the LPRI-EQV-HB resonates with $C_{PAR}$ to provide open circuit at HB second harmonic frequencies (i.e. 4.6 GHz-5.4 GHz).

Figure 10:
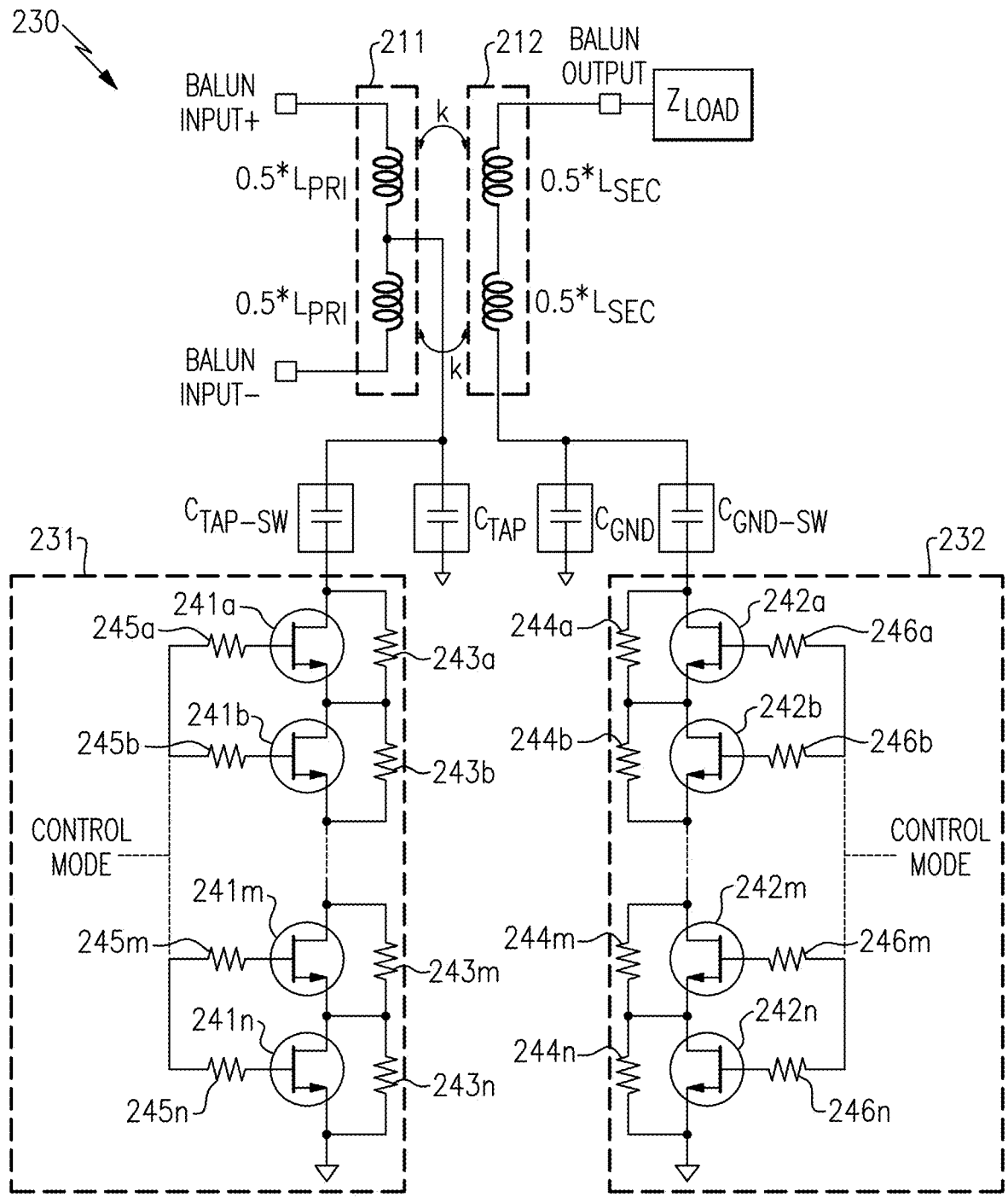
FIG. 10 is a schematic diagram of a reconfigurable output balun according to another embodiment.

FIG. 10 is a schematic diagram of a reconfigurable output balun 230 according to another embodiment. The reconfigurable output balun 230 includes a first coupled line 211, a second coupled line 212, a first fixed capacitor $C_{TAP}$, a first switchable capacitor $C_{TAP-SW}$, a second fixed capacitor $C_{GND}$, a second switchable capacitor $C_{GND-SW}$, a first switch 231, and a second switch 232.

As shown in FIG. 10, the first switch 231 includes field-effect transistors (FETs) 241a, 241b, ... 241m, 241n in series with the first switchable capacitor $C_{TAP-SW}$. Additionally, bias resistors 243a, 243b, ... 243m, 243n are coupled across the drain-to-source junctions of the FETs 241a, 241b, ... 241m, 241n, respectively. Furthermore, a mode control signal (CONTROL MODE) controls the gates of the FETs 241a, 241b, ... 241m, 241n through gate resistors 245a, 245b, ... 245m, 245n, respectively.

The second switch 232 includes FETs 242a, 242b, ... 242m, 242n in series with the second switchable capacitor $C_{GND-SW}$. Additionally, bias resistors 244a, 244b, ... 244m, 244n are coupled across the drain-to-source junctions of the FETs 242a, 242b, ... 242m, 242n, respectively. Furthermore, the mode control signal (CONTROL MODE) controls the gates of the FETs 242a, 242b, ... 242m, 242n through gate resistors 246a, 246b, ... 246m, 246n, respectively.

The illustrated embodiment depicts one implementation of controllable capacitors each implemented using a fixed capacitor in parallel with a switchable capacitor. For example, the first fixed capacitor $C_{TAP}$ is in parallel with the first switchable capacitor $C_{TAP-SW}$, which is turned on or off by the first switch 231. Additionally, the second fixed capacitor $C_{GND}$ is in parallel with the second switchable capacitor $C_{GND-SW}$, which is turned on or off by the second switch 232.

Thus, a stacked switch architecture is used for turning or off each switchable capacitor. The FETs in the stacked switch architecture can be implemented in a wide variety of ways, such as using silicon on insulator (SOI) technologies or complementary metal oxide semiconductor (CMOS) technologies.

The stacked switches can be designed to handle voltage swings at the $C_{GND}$ and $C_{TAP}$ nodes. For example, in some implementations, the $C_{TAP}$ node is implemented to handle large second harmonic voltage swings as well as supply voltage variation for envelope tracking operation, while the $C_{GND}$ node is implemented to sustain large fundamental voltage swings. The number of switches in each stack can be the same or different.

Implementations in CMOS/SOI can use multi-stack (for instance, 6-stack to 10-stack) FET switches can handle the voltage swings generated by the power amplifier in operation with the reconfigurable output balun over transmit band frequencies (for example, MB and HB transmit bands).

Figure 11:
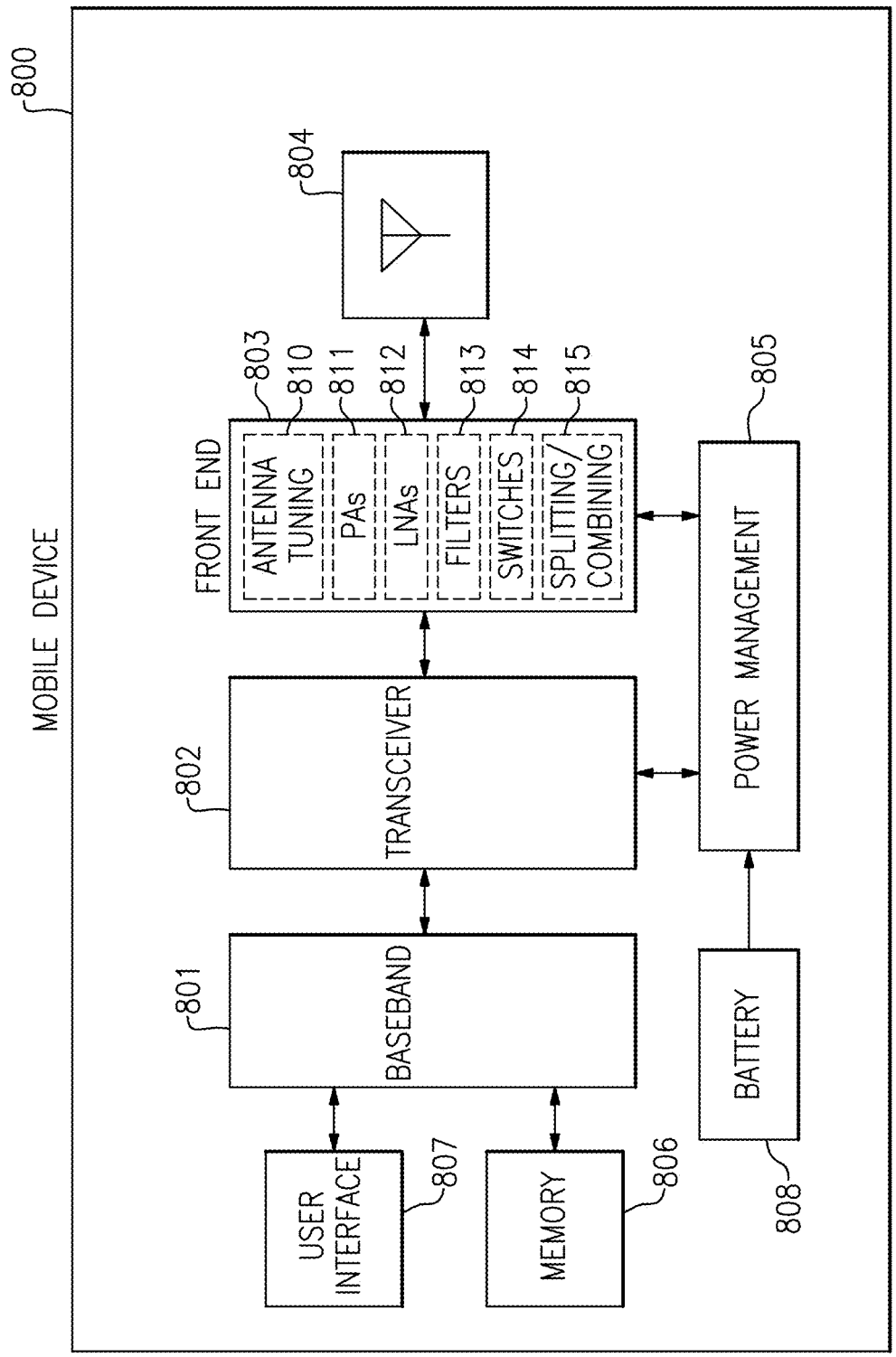
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible. One or more of the PAs 811 can include a push-pull amplifier implemented in accordance with the teachings herein.

The front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Figure 12:
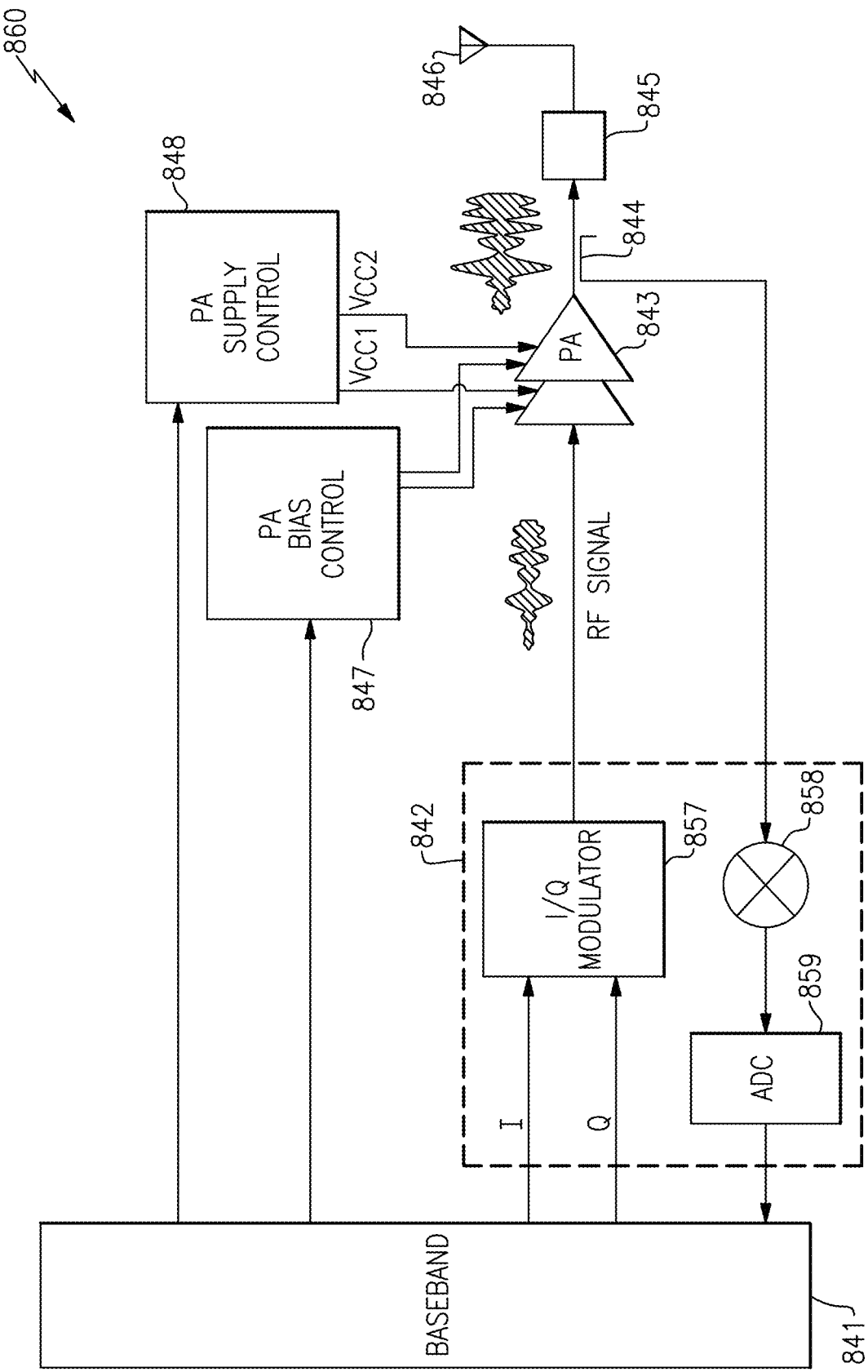
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be a push-pull amplifier implemented in accordance with any of the embodiments herein.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Applications

Some of the embodiments described above have provided examples in connection with mobile devices. However, the principles and advantages of the embodiments can be used for any other systems or apparatus that have needs for output baluns. Examples of such systems or apparatus include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above,"

"below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A push-pull power amplifier comprising:
an input selection circuit configured to output a selected radio frequency signal based on a band control signal, the selected radio frequency signal chosen from one of a first radio frequency signal of a first frequency band or a second radio frequency signal of a second frequency band;
an input balun;
a pair of amplifiers including a pair of inputs connected to the input balun and a pair of outputs, the pair of amplifiers operable to amplify the selected radio frequency signal; and
an output balun connected to the pair of outputs of the pair of amplifiers, the band control signal operable to control an impedance of the output balun.

2. The push-pull power amplifier of claim 1 wherein the output balun includes a first coupled line connected between a first output of the pair of outputs and a second output of the pair of outputs, a second coupled line electromagnetically coupled to the first coupled line, and at least one controllable capacitor controlled by the band control signal.

3. The push-pull power amplifier of claim 2 wherein the at least one controllable capacitor includes a first controllable capacitor coupled to a center tap of the first coupled line.

4. The push-pull power amplifier of claim 2 wherein the at least one controllable capacitor includes a first controllable capacitor coupled to one end of the second coupled line, the other end of the second coupled line configured to generate an amplified radio frequency signal.

5. The push-pull power amplifier of claim 2 wherein the first amplifier includes a first bipolar transistor and the second amplifier includes a second bipolar transistor, the first coupled line connected between a collector of the first bipolar transistor and a collector of the second bipolar transistor.

6. The push-pull power amplifier of claim 2 wherein the at least one controllable capacitor includes a first controllable capacitor including a first fixed capacitor in parallel with a switched capacitor.

7. The push-pull power amplifier of claim 6 wherein the switched capacitor incudes a plurality of field-effect transistors in series with a second fixed capacitor, the plurality of field-effect transistors having a gate voltage controlled by the band control signal.

8. A method of amplification, the method comprising:
outputting a selected radio frequency signal based on a band control signal using an input selection circuit of a push-pull power amplifier, the selected radio frequency signal chosen from one of a first radio frequency signal of a first frequency band or a second radio frequency signal of a second frequency band;
amplifying the selected radio frequency signal using a pair of amplifiers of the push-pull power amplifier, the pair of amplifiers including a pair of inputs connected to an input balun of the push-pull power amplifier; and
controlling an impedance of an output balun of the push-pull power amplifier using the band control signal, the output balun connected to a pair of outputs of the pair of amplifiers.

9. The method of claim 8 wherein the output balun includes a first coupled line connected between a first output of the pair of outputs and a second output of the pair of outputs, a second coupled line electromagnetically coupled to the first coupled line, and at least one controllable capacitor, the method further comprising controlling the at least one controllable capacitor using the band control signal.

10. The method of claim 9 wherein the at least one controllable capacitor includes a first controllable capacitor coupled to a center tap of the first coupled line.

11. The method of claim 9 wherein the at least one controllable capacitor includes a first controllable capacitor coupled to one end of the second coupled line, the other end of the second coupled line configured to generate an amplified radio frequency signal.

12. The method of claim 9 wherein the first amplifier includes a first bipolar transistor and the second amplifier includes a second bipolar transistor, the first coupled line connected between a collector of the first bipolar transistor and a collector of the second bipolar transistor.

13. The method of claim 9 wherein the at least one controllable capacitor includes a first controllable capacitor including a first fixed capacitor in parallel with a switched capacitor.

14. A mobile device comprising:
a front-end system including a push-pull power amplifier that includes an input selection circuit configured to output a selected radio frequency signal based on a band control signal, the selected radio frequency signal chosen from one of a first radio frequency signal of a first frequency band or a second radio frequency signal of a second frequency band, the push-pull power amplifier further including an input balun and a pair of amplifiers including a pair of inputs connected to the input balun, the pair of amplifiers operable to amplify the selected radio frequency signal, the push-pull power amplifier further including an output balun connected to a pair of outputs of the pair of amplifiers, the band control signal operable to control an impedance of the output balun; and
an antenna configured to transmit an amplified radio frequency signal outputted by the push-pull power amplifier.

15. The mobile device of claim 14 wherein the output balun includes a first coupled line connected between a first output of the pair of outputs and a second output of the pair of outputs, a second coupled line electromagnetically coupled to the first coupled line, and at least one controllable capacitor controlled by the band control signal.

16. The mobile device of claim 15 wherein the at least one controllable capacitor includes a first controllable capacitor coupled to a center tap of the first coupled line.

17. The mobile device of claim 15 wherein the at least one controllable capacitor includes a first controllable capacitor coupled to one end of the second coupled line, the other end of the second coupled line configured to generate the amplified radio frequency signal.

18. The mobile device of claim 15 wherein the first amplifier includes a first bipolar transistor and the second amplifier includes a second bipolar transistor, the first coupled line connected between a collector of the first bipolar transistor and a collector of the second bipolar transistor.

19. The mobile device of claim 15 wherein the at least one controllable capacitor includes a first controllable capacitor including a first fixed capacitor in parallel with a switched capacitor.

20. The mobile device of claim 19 wherein the switched capacitor incudes a plurality of field-effect transistors in series with a second fixed capacitor, the plurality of field-effect transistors having a gate voltage controlled by the band control signal.

* * * * *